United States Patent
Beer et al.

(10) Patent No.: US 9,013,013 B1
(45) Date of Patent: Apr. 21, 2015

(54) PRESSURE SENSOR PACKAGE HAVING A STACKED DIE ARRANGEMENT

(71) Applicant: Infineon Technologies AG, Neubiberg (DE)

(72) Inventors: Sebastian Beer, Regensburg (DE); Helmut Wietschorke, Laberweinting (DE); Jochen Dangelmaier, Beratzhausen (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/098,585

(22) Filed: Dec. 6, 2013

(51) Int. Cl.
*H01L 29/84* (2006.01)
*G01L 19/00* (2006.01)
*H01L 25/00* (2006.01)

(52) U.S. Cl.
CPC ............ *G01L 19/0069* (2013.01); *H01L 25/00* (2013.01); *H01L 25/50* (2013.01)

(58) Field of Classification Search
None
See application file for complete search history.

(56) References Cited

U.S. PATENT DOCUMENTS

2012/0181639 A1* 7/2012 Ehrenpfordt et al. ......... 257/416

* cited by examiner

*Primary Examiner* — Kyoung Lee
(74) *Attorney, Agent, or Firm* — Murphy, Bilak & Homiller, PLLC

(57) ABSTRACT

A pressure sensor package includes a pressure sensor having a first side with a pressure sensor port, a second side opposite the first side, and electrical contacts. A logic die stacked on the pressure sensor has a first side attached to the second side of the pressure sensor and a second side opposite the first side with electrical contacts. The logic die is laterally offset from the electrical contacts of the pressure sensor and operable to process signals from the pressure sensor. Electrical conductors connect the electrical contacts of the pressure sensor to the electrical contacts of the logic die. Molding compound encapsulates the pressure sensor, the logic die and the electrical conductors, and has an opening defining an open passage to the pressure sensor port. External electrical contacts are provided at a side of the pressure sensor package.

22 Claims, 8 Drawing Sheets

PRESSURE SENSOR PACKAGE HAVING A STACKED DIE ARRANGEMENT

TECHNICAL FIELD

The instant application relates to pressure sensor packages, and more particularly to arrangement of components within pressure sensor packages.

BACKGROUND

Pressure sensors are critical components in many applications such as tire pressure monitoring. Pressure sensors are typically molded in a package to ensure the pressure sensor works reliably over a wide range of temperature, humidity and load conditions. A typical pressure sensor package includes a pressure sensor die with a pressure sensor port and a logic die such as an ASIC (Application-Specific Integrated Circuit). The logic die is electrically connected to the pressure sensor and processes the signals provided by the pressure sensor.

A conventional pressure sensor package includes pressure sensor and logic dies disposed laterally adjacent one another on a substrate such as a die paddle of a lead frame. The dies are typically glued to different regions of the die paddle and electrical connections made to the dies by wire bonding. The pressure sensor is mounted in a hole in the die paddle through which the pressure signal impinges on the active surface of the pressure sensor chip such as a piezo-active suspended membrane. The assembly is encapsulated with molding compound so that the pressure sensor port remains open by the injection molding tool. Electrical connections protruding from the molded package are severed from the lead frame and bent so that board mounting is possible. These external electrical connections are typically bent toward the same side of the pressure sensor package as the pressure sensor port, making board mounting more challenging in that the pressure sensor port must remain unobstructed to ensure proper operation. Also, laterally spacing apart the pressure sensor and logic dies on the same substrate substantially increases the footprint of the pressure sensor package.

SUMMARY

According to an embodiment of a pressure sensor package, the package comprises a pressure sensor comprising a first side with a pressure sensor port, a second side opposite the first side, and electrical contacts. The package further comprises a logic die stacked on the pressure sensor and including a first side attached to the second side of the pressure sensor and a second side opposite the first side with electrical contacts. The logic die is laterally offset from the electrical contacts of the pressure sensor and operable to process signals from the pressure sensor. Electrical conductors connect the electrical contacts of the pressure sensor to the electrical contacts of the logic die. Molding compound encapsulates the pressure sensor, the logic die and the electrical conductors. The molding compound has an opening defining an open passage to the pressure sensor port. External electrical contacts are provided at a side of the pressure sensor package.

According to an embodiment of a method of manufacturing a pressure sensor package, the method comprises: providing a pressure sensor comprising a first side with a pressure sensor port, a second side opposite the first side, and electrical contacts, and a logic die comprising a first side and a second side opposite the first side with electrical contacts, the logic die operable to process signals from the pressure sensor; attaching the first side of the logic die to the second side of the pressure sensor so that the logic die is laterally offset from the electrical contacts of the pressure sensor; connecting the electrical contacts of the pressure sensor to the electrical contacts of the logic die via electrical conductors; encapsulating the pressure sensor, the logic die and the electrical conductors with molding compound, the molding compound having an opening defining an open passage to the pressure sensor port; and providing external electrical contacts at a side of the pressure sensor package.

According to an embodiment of a pressure sensor assembly, the assembly comprises a board comprising an insulating member and a plurality of traces insulated from one another by the insulating member, and a pressure sensor package attached to the board. The pressure sensor package comprises a pressure sensor comprising a first side with a pressure sensor port, a second side opposite the first side, and electrical contacts. The package further comprises a logic die stacked on the pressure sensor and including a first side attached to the second side of the pressure sensor and a second side opposite the first side with electrical contacts. The logic die is laterally offset from the electrical contacts of the pressure sensor and operable to process signals from the pressure sensor. Electrical conductors connect the electrical contacts of the pressure sensor to the electrical contacts of the logic die. Molding compound encapsulates the pressure sensor, the logic die and the electrical conductors. The molding compound has an opening defining an open passage to the pressure sensor port. External electrical contacts are provided at a side of the pressure sensor package. The external electrical contacts of the pressure sensor package are connected to at least some of the traces of the board.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4, which includes

DETAILED DESCRIPTION

According to embodiments described herein, a pressure sensor package is provided that comprises a pressure sensor and a logic die for processing signals from the pressure sensor. The pressure sensor has a first side with a pressure sensor port, a second side opposite the first side, and electrical contacts. The logic die is stacked on the pressure sensor to reduce the footprint of the pressure sensor package. The logic die has a first side attached to the second side of the pressure sensor and a second side opposite the first side with electrical contacts. The logic die is laterally offset from the electrical contacts of the pressure sensor so as to not interfere with electrical conductors that connect the electrical contacts of the pressure sensor to the electrical contacts of the logic die. Molding compound encapsulates the pressure sensor, the logic die and the electrical conductors. The molding compound has an opening defining an open passage to the pressure sensor port so that the pressure sensor port remains unobstructed by the molding compound. External electrical contacts are provided at a side of the pressure sensor package for providing electrical connections to the pressure sensor package. A corresponding method of manufacturing the pressure sensor package is also provided.

Figure 1:
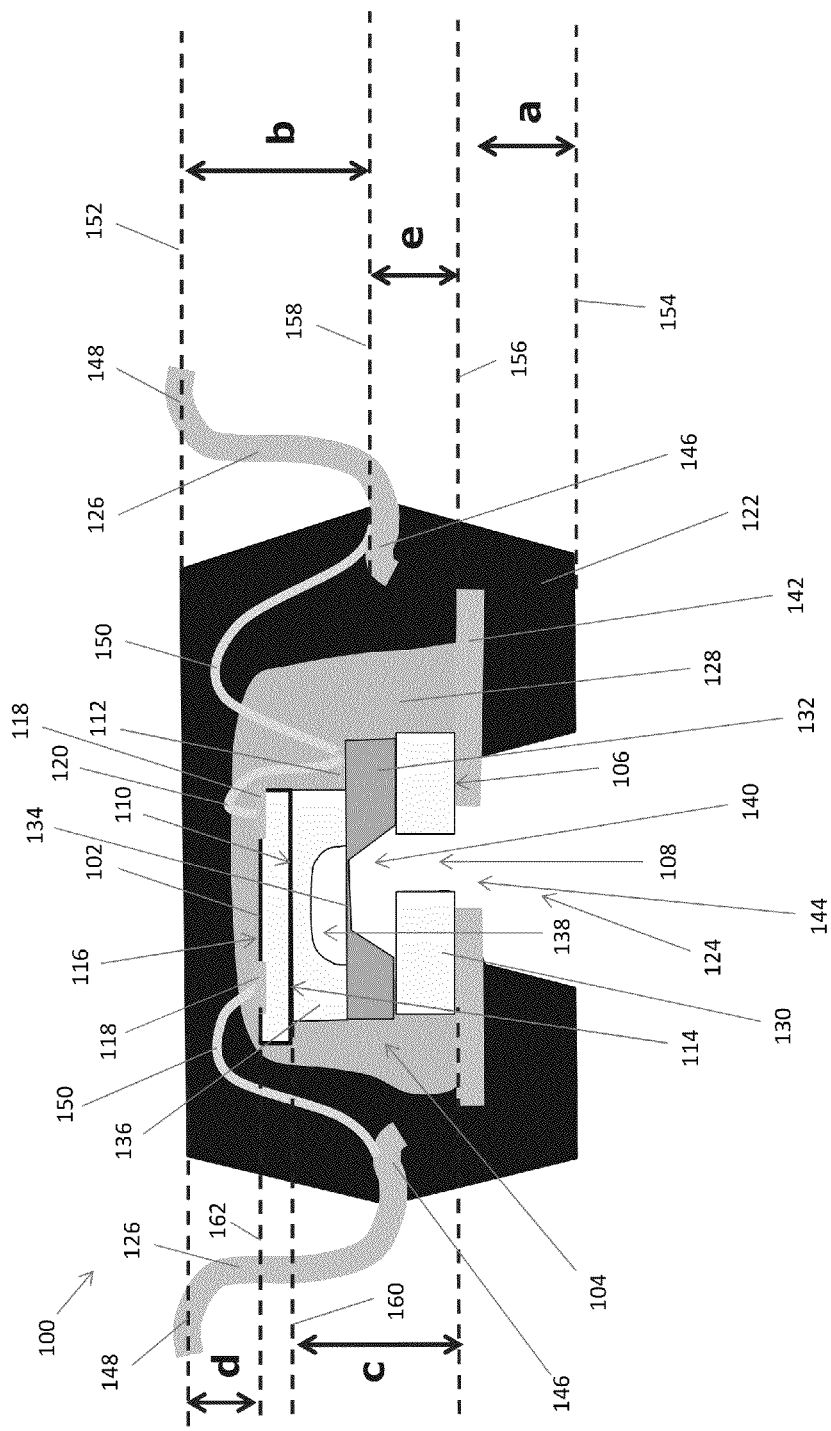
FIG. 1 illustrates a cross-sectional view of an embodiment of a pressure sensor package having a stacked die arrangement.

FIG. 1 illustrates an embodiment of a pressure sensor package 100 with a logic die 102 stacked on a pressure sensor 104 to reduce the footprint of the pressure sensor package 100. The pressure sensor 104 has a first side 106 with a pressure sensor port 108, a second side 110 opposite the first side 106, and electrical contacts 112. The logic die 102 has a first side 114 attached to the second side 110 of the pressure sensor 104 e.g. by an adhesive, solder or other standard die attach material. The second side 116 of the logic die 102 opposite the first side 114 has electrical contacts 118 for the logic die 102. The logic die 102 is laterally offset from the electrical contacts 112 of the pressure sensor 104 so as not to interfere with electrical connections to the pressure sensor 104. The logic die 102 is preferably smaller in area than the side 110 of the pressure sensor 104 to which the logic die 102 is attached. Otherwise, the logic die 102 laterally overhangs the pressure sensor 104 as shown in FIG. 1. In one embodiment, the logic die 102 is an ASIC designed to process signals from the pressure sensor 104. This can include signal conditioning, amplification, digitizing, transmitting, receiving, etc. Electrical conductors 120 connect the electrical contacts 112 of the pressure sensor 104 to the electrical contacts 118 of the logic die 102. In FIG. 1, the electrical conductors 120 are shown as wire bonds. However, other types of electrical conductors 120 can be used such as ribbons, metal clips, etc.

In each case, molding compound 122 encapsulates the pressure sensor 104, the logic die 102 and the electrical conductors 120. The molding compound 122 has an opening 124 defining an open passage to the pressure sensor port 108 of the pressure sensor 104. External electrical contacts 126 are provided at the same or opposite side of the pressure sensor package 100 as the pressure sensor port 108. The external electrical contacts 126 provide points of electrical connection to the pressure sensor 104 and logic die 102 encapsulated by the molding compound 122. The logic die 102, the pressure sensor 104 and part of the electrical conductors 120 can be covered by a silicone gel 128. The silicone gel 128 is interposed between the molding compound 122 and both the logic die 102 and the pressure sensor 104 to decouple the logic die 102 and pressure sensor 104 from mechanical stress generated by the molding compound 122. Any standard silicone gel 128 can be used.

According to the embodiment shown in FIG. 1, the pressure sensor 104 includes a first glass substrate 130 comprising an opening 108 forming the pressure sensor port, a silicon die 132 stacked on the first glass substrate 130 and comprising a piezo-active suspended membrane 134, and a second glass substrate 136 stacked on the silicon die 132 and comprising a cavity 138. Signals provided by the silicon die 132 correspond to the amount of movement or displacement of the piezo-active suspended membrane 134 in response to the amount of air flow impinging on the membrane 134. To this end, the opening 108 in the first glass substrate 130 is aligned with the open passage 124 of the molding compound 122 and with the membrane 134 at one side of the membrane 134 to permit air flowing into the open passage 124 to impinge upon the membrane 134. The cavity 138 in the second glass substrate 136 is aligned with the membrane 134 at an opposite side of the membrane 134 as the opening 108 in the first glass substrate 130 to permit movement of the membrane 134 in response to the air flow.

According to another embodiment of the pressure sensor 104, one or both of the glass substrates 130, 136 are omitted and the pressure sensor 104 comprises at least the silicon die 132 with the piezo-active suspended membrane 134 over a recessed region 140 of the silicon die 132. The recessed region 140 of the silicon die 132 forms the pressure sensor port according to this embodiment, and is aligned with the open passage 124 of the molding compound 122 to permit incoming air flow to impinge upon the membrane 134 of the silicon die 132.

In general, any standard pressure sensor die can be used. The pressure sensor 104 can include active device areas including transistors e.g. for sensing acceleration. The first side 106 of the pressure sensor 104 can be attached by solder, adhesive or other standard die attach material to a metal substrate 142 such as a die paddle (also commonly referred to as die pad) of a lead frame. The metal substrate 142 is partly encapsulated by the molding compound 122 so that an opening 144 in the metal substrate 142 aligned with the pressure sensor port 108 is uncovered by the molding compound 122 and permits incoming air flow to impinge upon the membrane 134 of the pressure sensor 104.

In the case of a lead frame die paddle as the metal substrate 142 to which the first side 106 of the pressure sensor 104 is attached, the external electrical contacts 126 of the pressure sensor package 100 can be leads of the lead frame. The leads 126 are embedded in the molding compound 122 at a first end 146 and protrude out of the molding compound 122 at a second end 148. The leads 126 are bent so that the second end 148 of the leads form external electrical contacts 126 at the side of the pressure sensor package 100 opposite the pressure sensor port 108. Alternatively, the leads 126 can be bent in the other direction so that the second end 148 of the leads form external electrical contacts 126 at the side of the pressure sensor package 100 with the pressure sensor port 108. Additional electrical conductors 150 such as wire bonds, ribbons, metal clips, etc. connect the first end 146 of the leads 126 to the electrical contacts 112, 118 of at least one of the pressure sensor 104 and the logic die 102. The first end 146 of the leads 126 can terminate in the molding compound 122 at a different level than the metal substrate 142 so that the first end 146 of the leads 126 and the metal substrate 142 are vertically offset within the molding compound 122. This vertical offset is also referred to herein as downset.

In more detail with regard to the downset and other spacings of the pressure sensor package 100, a first reference plane 152 corresponds to a side of the molding compound 122 adjacent the logic die 102, a second reference plane 154 corresponds to a side of the molding compound 122 with the opening 124, a third reference plane 156 corresponds to a side of the metal substrate 142 attached to the pressure sensor 104, a fourth reference plane 158 corresponds to a side of the first end 146 of the leads 126 facing away from the metal substrate 142, a fifth reference plane 160 corresponds to the first side 114 of the logic die 102, and a sixth reference plane 162 corresponds to the second side 116 of the logic die 102.

A vertical distance a is measured between the second and third reference planes 154, 156, a vertical distance b is measured between the first and fourth reference planes 152, 158, a vertical distance c is measured between the third and fifth reference planes 156, 160, a vertical distance d is measured between the first and sixth reference planes 152, 162, and a vertical distance e is measured between the third and fourth reference planes 156, 158. The vertical distance e is the downset. The downset allows for a symmetric package. A symmetric package in this case has approximately the same mass above and below (i.e. centered about) the pressure sensor 104. In some embodiments, the downset e is greater than five times (5×) the thickness of the metal substrate 142. For example, the downset can be about 1 mm for a metal substrate thickness of 0.15 mm. A generally symmetric package can be realized if d≈a and 0.5<a/b<2. In some case, the thickness c of the pressure sensor 104 is greater than 1 mm.

In the case of the pressure sensor 104 being mounted to a metal die paddle 142 of a copper lead frame strip, the die paddle 142 can have a plurality of support structures or so-called tie bars (not shown in FIG. 1) extending outward from the die paddle 142 and connecting the die paddle 142 to the periphery of the copper lead frame strip.

Figure 2:
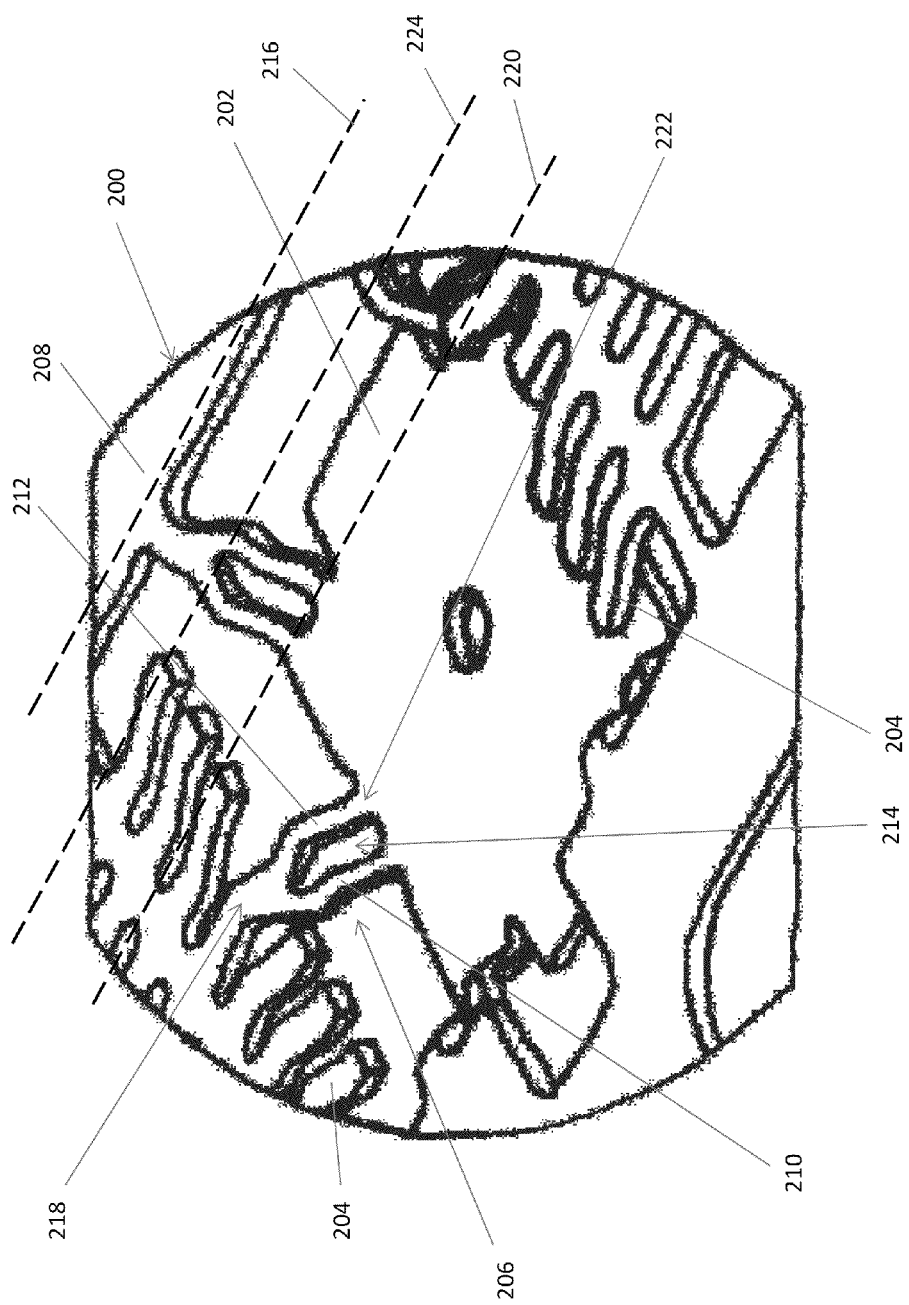
FIG. 2 illustrates a partial perspective view of an embodiment of a lead frame strip with leads and die paddles vertically offset from the leads for use in pressure sensor packages having a stacked die arrangement.

FIG. 2 shows an embodiment of a copper lead frame strip 200 with die paddles 202 vertically offset from leads 204 of the lead frame strip 200 by tie bar support structures 206. Lead frame strips are typically constructed from flat sheet metal, e.g. by stamping or etching. For example, the sheet metal can be exposed to chemical etchants that remove areas not covered by photoresist. Other processing can be performed, e.g. laser etching to pattern the sheet metal. After the patterning process, the patterned frames are singulated (separated) into lead frame strips. Part of one such lead frame strip 200 is shown in FIG. 2.

The tie bar support structures 206 connecting each die paddle 202 to the periphery 208 of the lead frame strip 200 allow the die paddles 202 to sit lower than the leads 204, so that each die paddle 202 and the corresponding set of leads 204 are vertically offset from one another after molding e.g. as shown in FIG. 1. In one embodiment, the lead frame strip 200 is made of copper and each of the tie bars 206 are subjected to a deep drawing process in order to realize a vertical offset (downset) between each die paddle 202 and the corresponding set of leads 204.

Drawing a structure made of copper typically involves hammering, filing, rolling or swaging to lengthen the structure. As the structure is drawn its volume remains the same, so as the diameter decreases, the length increases. Copper is more difficult to draw than softer metals such as aluminum. To realize a vertical offset e of at least five times the thickness of the die paddles, each of the tie bar support structures 206 can be formed as a pair of connectors 210, 212 with a gap 214 between the connectors 210, 212 as shown in FIG. 2. Segmenting the tie bar connector structures 206 with a gap 214 between each pair of connectors 210, 212 allows for deeper drawing of the tie bars 206 because each connector 210, 212 has less copper volume, allowing the tie bars 206 to be lengthened further than would otherwise be possible with tie bars of a non-segmented construction (i.e. no gap).

The tie bar support structures 206 can be formed by drawing the copper lead frame strip 200 using a multi-step drawing process. That is, the tie bars 206 can be drawn in multiple steps. Such a multi-step drawing process yields tie bar support structures 206 which extend along a first planar level 216 at a first end 218 of the tie bar support structures 206 attached to the periphery 208 of the copper lead frame strip 200, extend along a second planar level 220 at a second end 222 of the tie bars 206 attached the die paddles 202 and extend along a third planar level 224 between the first and second ends 218, 222 of the support structures 206 as shown in FIG. 2.

Figure 3:
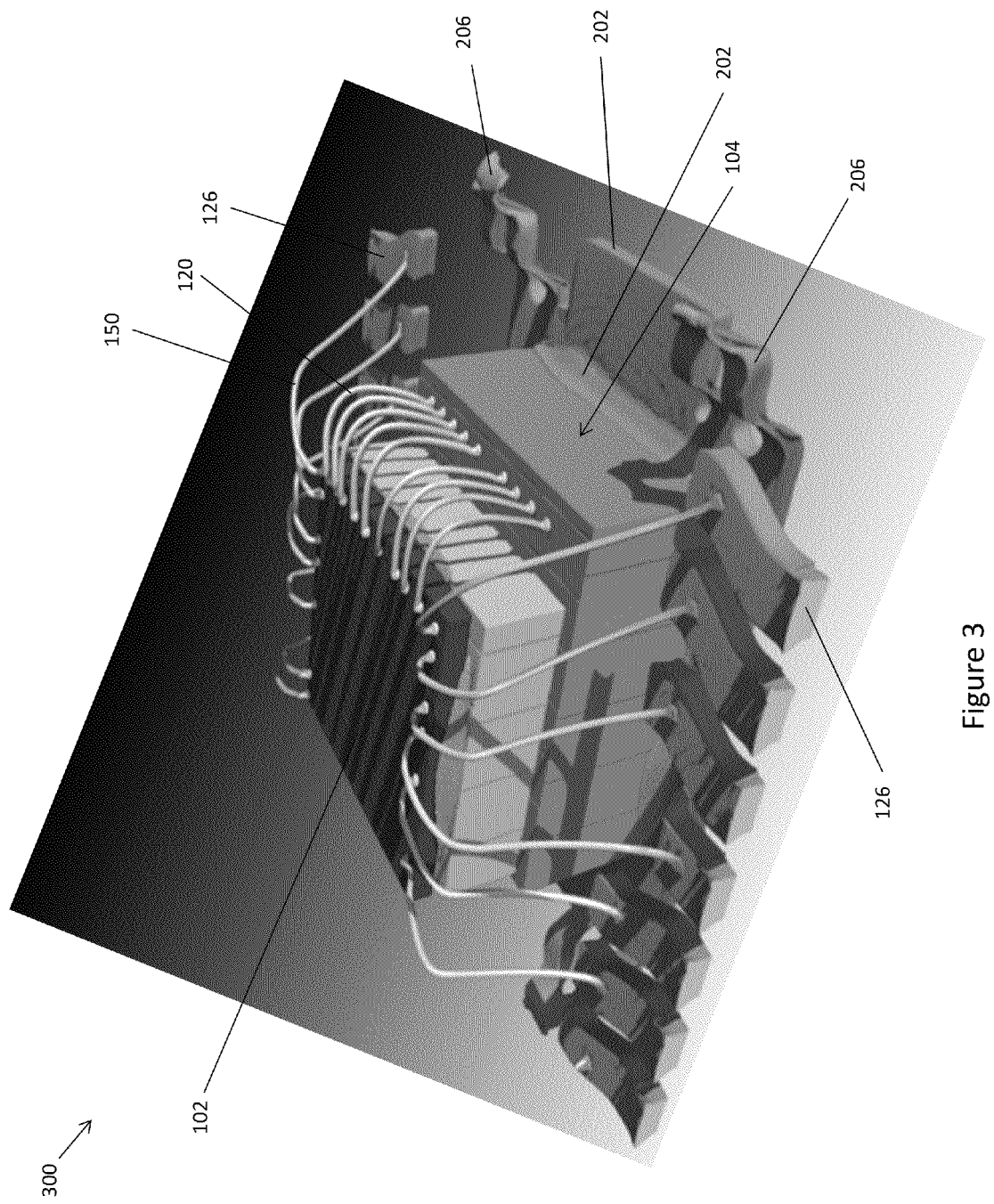
FIG. 3 illustrates a perspective view of another embodiment of a pressure sensor package having a stacked die arrangement.

FIG. 3 shows an embodiment of a pressure sensor package 300 with the pressure sensor 104 and logic die 102 stacked on a downset die paddle 202 of the lead frame strip 200 of FIG. 2 without molding compound for ease of illustration. The pressure sensor 104 is attached to the die paddle 202 by via solder, adhesive or other standard die attach material 203. The tie bar support structures 206 and leads 204 have been severed from the periphery 208 of the lead frame strip 200 in FIG. 3. The die paddle 202 is vertically offset from the leads 206 of the lead frame strip 200. To realize such a downset, the tie bar support structures 206 can extend along three different planar levels 216, 220, 224 within the package 300 as previously described herein. Utilizing such multi-stepped connector structures 206 yields a die paddle 202 with a vertical offset e of at least five times the thickness of the die paddle 202. With such flexibility in the placement of the die paddle 202 with respect to other components of the package 300 e.g. particularly the leads 204, a symmetric package design can be realized in that the package 300 has approximately the same mass above and below the pressure sensor 104.

Figure 4A:
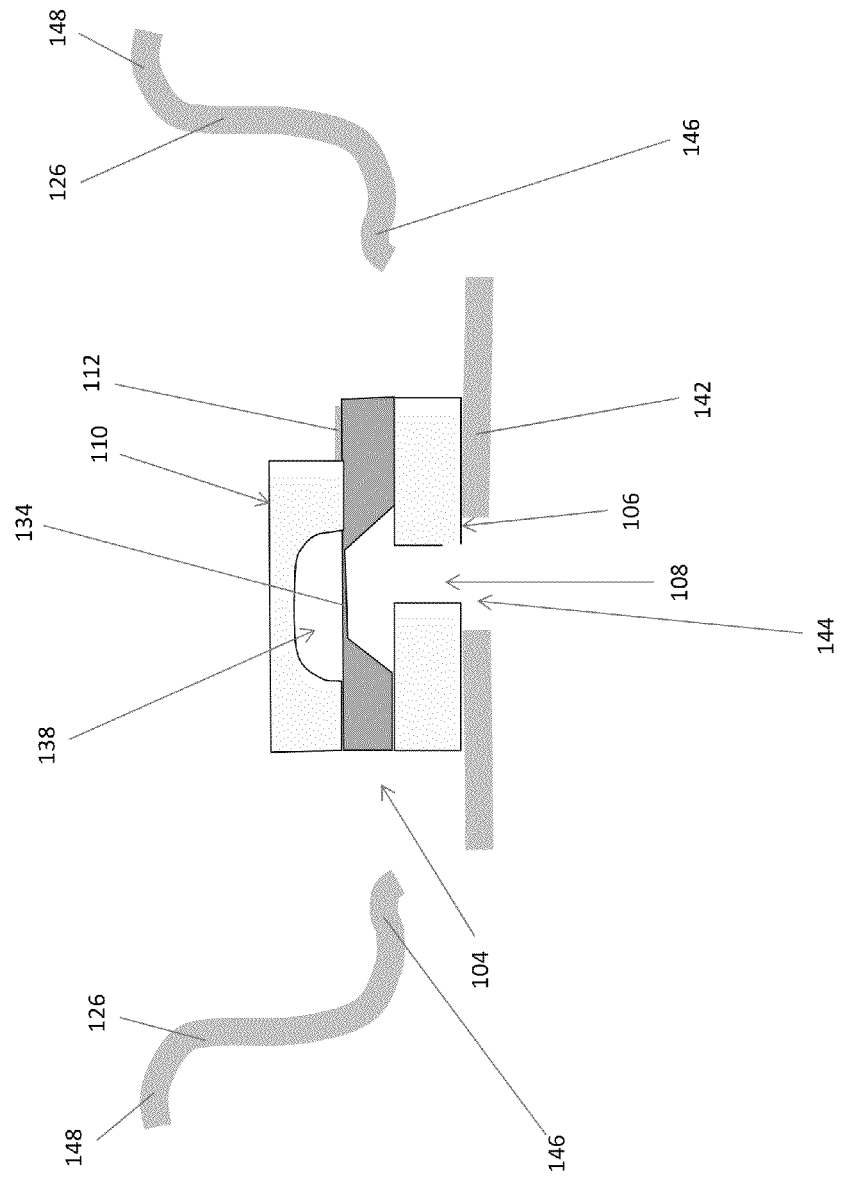
FIGS. 4A through 4D, illustrates different stages of an embodiment of a method of manufacturing a pressure sensor package having a stacked die arrangement.

FIG. 4, which includes FIGS. 4A through 4D, illustrates cross-sectional views of a pressure sensor package during different stages of manufacture. FIG. 4A shows a pressure sensor 104 having a first side 106 with a pressure sensor port 108, a second side 110 opposite the first side 106, and electrical contacts 112. The first side 106 of the pressure sensor 104 is attached to a metal substrate 142 such as a die paddle of a lead frame strip. An opening 144 in the die paddle 142 permits air flow to impinge upon the membrane 134 of the pressure sensor 104. The die paddle 142 is vertically offset from the corresponding leads 126 of the lead frame strip as previously described herein.

Figure 4B:
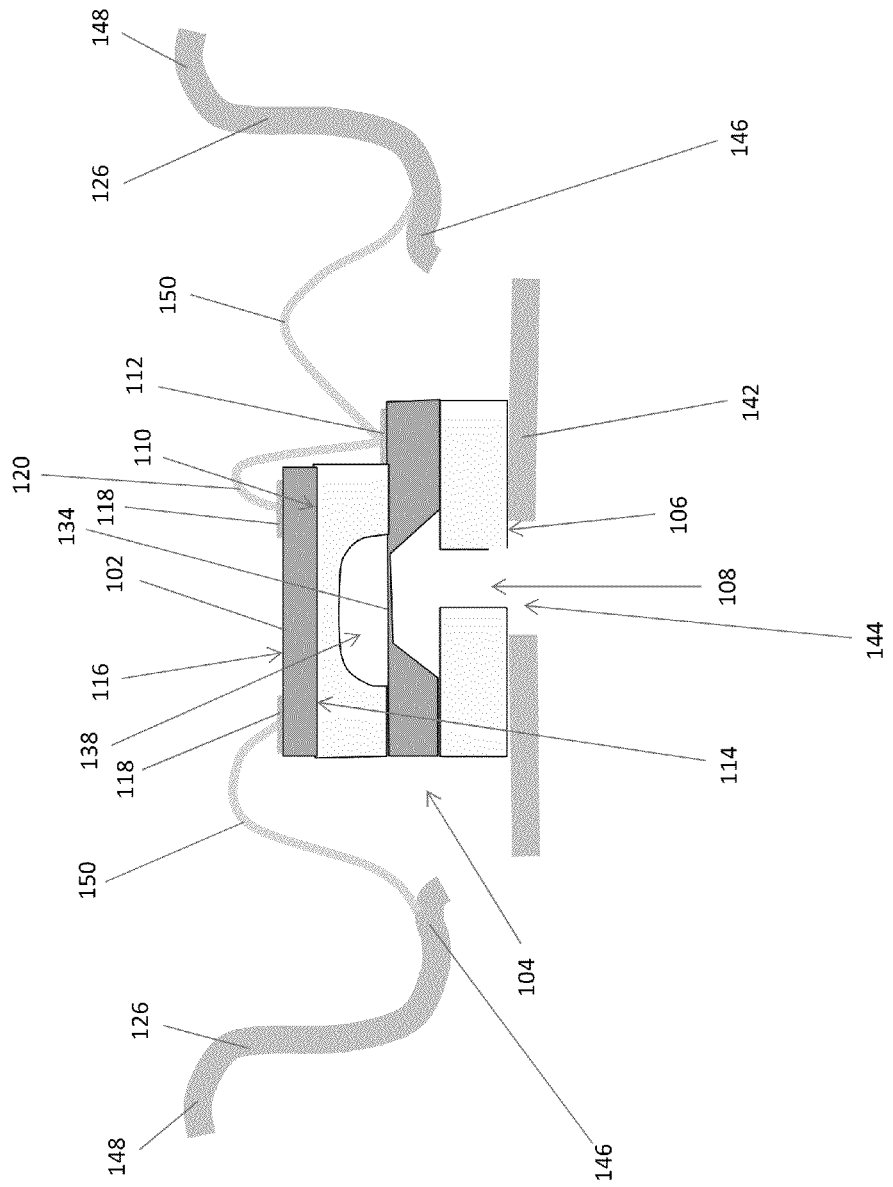

FIG. 4B shows the structure after a logic die 102 having a first side 114 and a second side 116 opposite the first side 114 with electrical contacts 118 is stacked on the pressure sensor 104. The logic die 102 processes signals from the pressure sensor 104. The stacked die arrangement includes the first side 114 of the logic die 102 being attached to the second side 110 of the pressure sensor 104 e.g. via solder, adhesive or other standard die attach material so that the logic die 102 is laterally offset from the electrical contacts 112 of the pressure sensor 104. The logic die 102 is smaller in area than the side 110 of the pressure sensor 104 to which the logic die 102 is attached according to this embodiment, so that the logic die 102 does not laterally overhang the pressure sensor 104. The electrical contacts 112 of the pressure sensor 104 are connected to the electrical contacts 118 of the logic die 102 via electrical conductors. Additional electrical conductors 150 connect the first end 146 of the leads 126 to the electrical contacts 112, 118 of at least one of the pressure sensor 104 and the logic die 102. Bond wires, ribbons, metal clips, etc. can be used to form these connections.

Figure 4C:
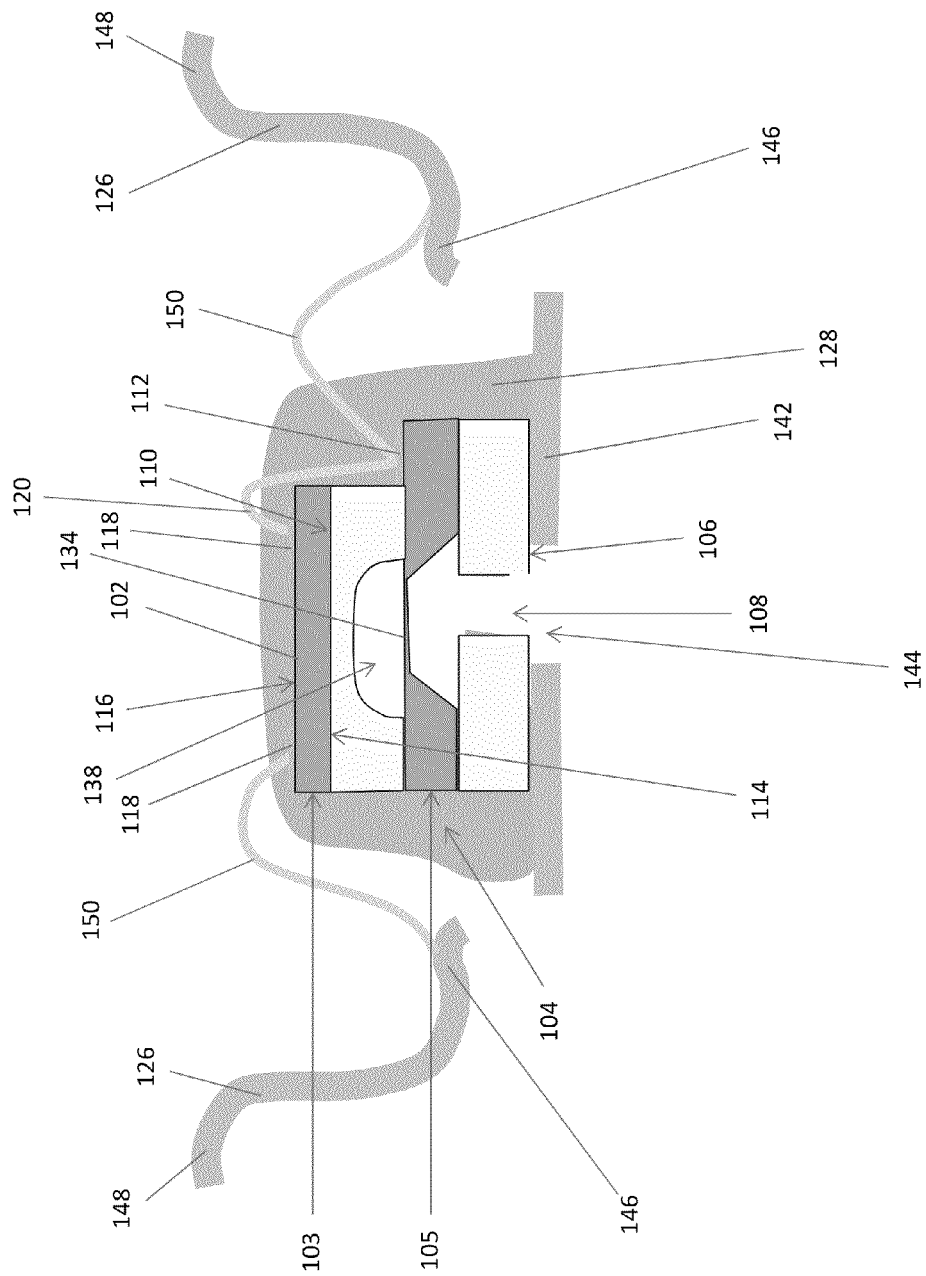

FIG. 4C shows the structure after the logic die 102, the pressure sensor 104 and part of the electrical conductors 120 electrically connecting the logic die 102 and pressure sensor 104 are covered by a silicone gel 128. In one embodiment, a beam of silicone gel is dispensed around the lateral sides 103, 105 of the logic die 102 and the pressure sensor 104, respectively. In a second gel dispensing process, small drops of silicone gel are deposited on the side 116 of the logic die 102 facing away from the pressure sensor 104. The silicone gel is then cured. Any standard silicone gel 128 can be used in the pressure sensor package.

Figure 4D:
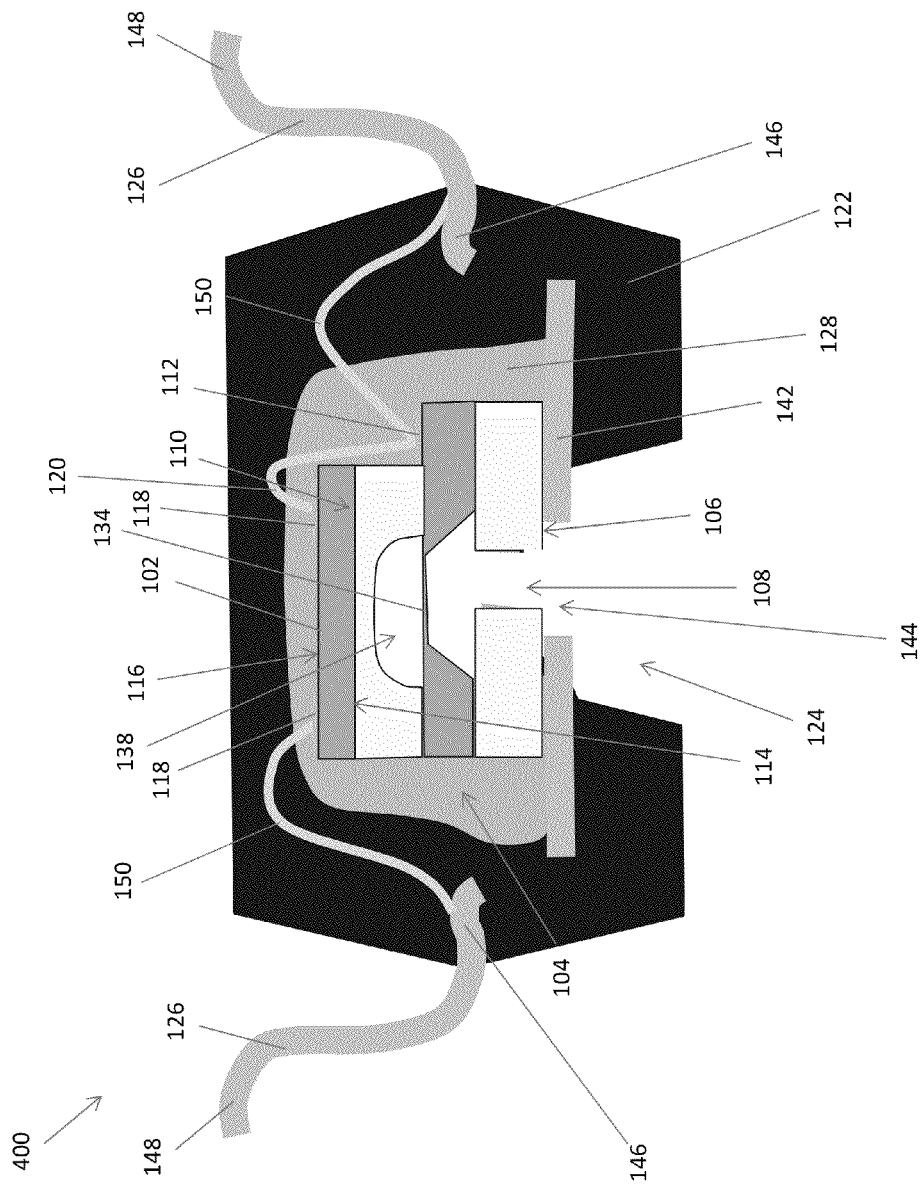

FIG. 4D shows the structure after the pressure sensor 104, the logic die 102 and the electrical conductors 120, are encapsulated with molding compound 122. The molding compound 122 has an opening 124 defining an open passage to the pressure sensor port 108. The opening 124 in the molding compound 122 can be realized by inserting an appropriately shaped die in the injection molding tool. After molding, the leads 126 protrude out of the molding compound 122 and are bent to provide electrical contacts at the side of the pressure sensor package opposite the pressure sensor port 108. One end 146 of the leads 126 can terminate in the molding compound 122 at a different level than the die paddle 142 so that this end 146 of the leads 126 and the die paddle 142 are vertically offset within the molding compound 122 as previously described herein. The leads 126 and tie bar support structures which secure the die paddle 142 to the periphery of the lead frame strip are severed from the periphery of the lead frame strip after molding so that the leads 126 and the die paddle 142 are disconnected from the periphery of the lead frame strip (see FIGS. 2 and 3), realizing an individual pressure sensor package 400.

Figure 5:
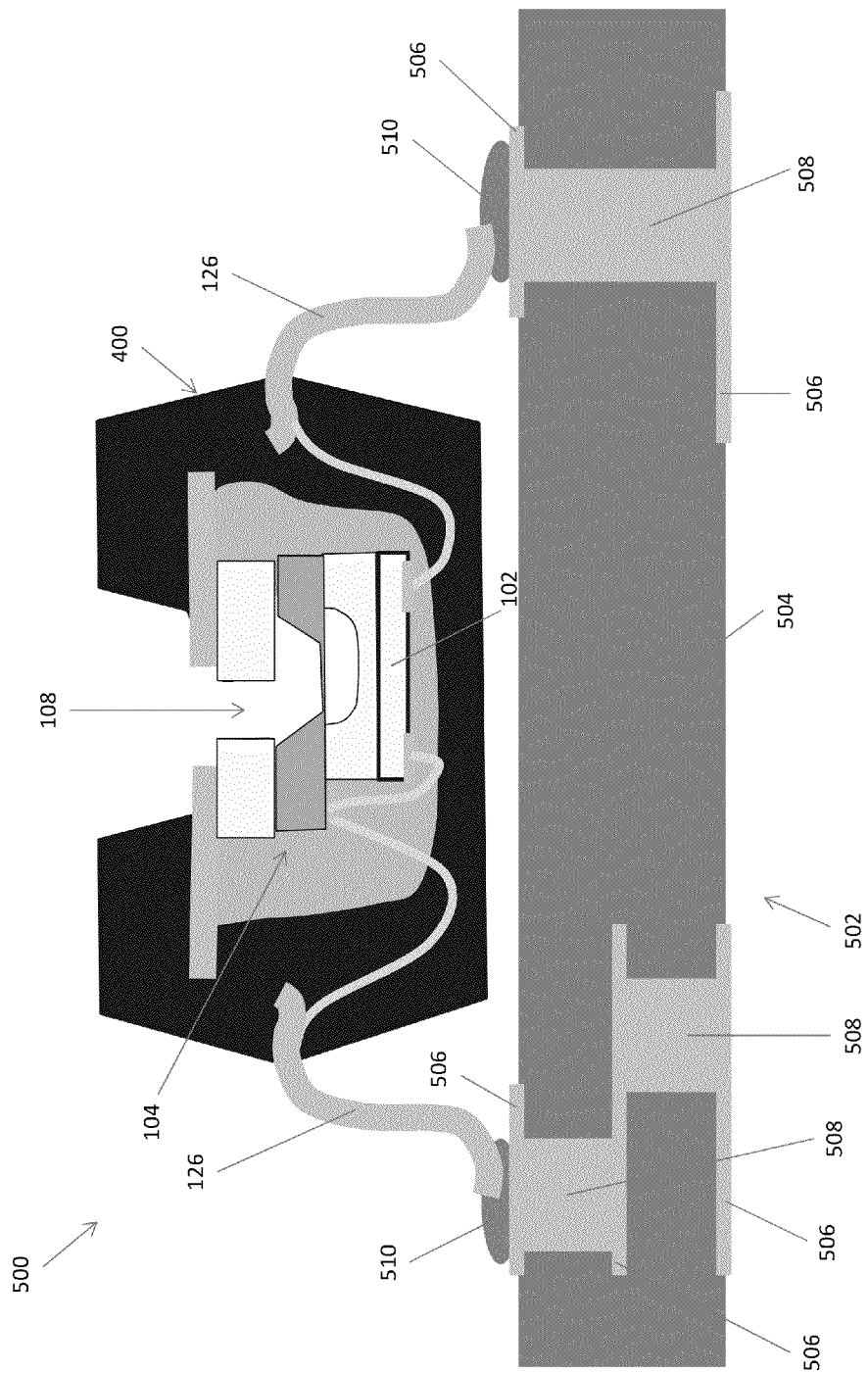
FIG. 5 illustrates a cross-sectional view of an embodiment of a pressure sensor assembly comprising a board and a pressure sensor package having a stacked die arrangement attached to the board.

FIG. 5 illustrates an embodiment of a pressure sensor assembly 500 comprising the pressure sensor package 400 of FIG. 4D attached to a board 502 such as a PCB (printed circuit board). The board 502 includes an insulating member 504 and a plurality of traces 506 insulated from one another by the insulating member 504. Conductive vias 508 extend completely or partly through the board 502 to connect different ones of the traces 506. The pressure sensor package 400 has the construction previously described herein, and is attached to a side of the board 502. The external electrical contacts 126 at the side of the pressure sensor package 400 opposite the pressure sensor port 108 are connected to at least some of the traces 506 of the board 502 e.g. by solder 510 to provide electrical connections to the pressure sensor 104 and logic die 102 included in the pressure sensor package 400. Such a configuration ensures that the pressure sensor port 108 remains unobstructed by the board 502 after the pressure sensor package 400 is mounted to the board 502. In another embodiment, the external electrical contacts 126 can be bent so that the second end 148 of the leads form external electrical contacts 126 at the side of the pressure sensor package 100 with the pressure sensor port 108. In this case, the pressure sensor port 108 would face the board 502 and the board 502 can have an opening aligned with the pressure sensor port 108 to permit unrestricted access to the port 108.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A pressure sensor package, comprising:
    a pressure sensor comprising a first side with a pressure sensor port, a second side opposite the first side, and electrical contacts;
    a logic die stacked on the pressure sensor and comprising a first side attached to the second side of the pressure sensor and a second side opposite the first side with electrical contacts, the logic die laterally offset from the electrical contacts of the pressure sensor and operable to process signals from the pressure sensor;
    electrical conductors connecting the electrical contacts of the pressure sensor to the electrical contacts of the logic die;
    molding compound encapsulating the pressure sensor, the logic die and the electrical conductors, the molding compound having an opening defining an open passage to the pressure sensor port; and
    external electrical contacts at a side of the pressure sensor package.

2. The pressure sensor package of claim 1, further comprising:
    a metal substrate attached to the first side of the pressure sensor, the metal substrate partly encapsulated by the molding compound so that an opening in the metal substrate aligned with the pressure sensor port is uncovered by the molding compound.

3. The pressure sensor package of claim 2, further comprising:
    a plurality of leads embedded in the molding compound at a first end and protruding out of the molding compound at a second end, the second end of the leads forming the external electrical contacts of the pressure sensor package; and
    additional electrical conductors connecting the first end of the leads to the electrical contacts of at least one of the pressure sensor and the logic die.

4. The pressure sensor package of claim 3, wherein the first end of the leads terminate in the molding compound at a different level than the metal substrate so that the first end of the leads and the metal substrate are vertically offset within the molding compound.

5. The pressure sensor package of claim 4,
    wherein a first reference plane corresponds to a side of the molding compound adjacent the logic die, a second reference plane corresponds to a side of the molding compound with the opening, a third reference plane corresponds to a side of the metal substrate attached to the pressure sensor, a fourth reference plane corresponds to a side of the first end of the leads facing away from the metal substrate, a fifth reference plane corresponds to the first side of the logic die, and a sixth reference plane corresponds to the second side of the logic die,
    wherein a vertical distance a is measured between the second and third reference planes,
    wherein a vertical distance b is measured between the first and fourth reference planes,
    wherein a vertical distance c is measured between the third and fifth reference planes,
    wherein a vertical distance d is measured between the first and sixth reference planes,
    wherein a vertical distance e is measured between the third and fourth reference planes, wherein d≈a,
wherein 0.5<a/b<2.

6. The pressure sensor package of claim 5, wherein c>1 mm.

7. The pressure sensor package of claim 5, wherein e is greater than five times the thickness of the metal substrate.

8. The pressure sensor package of claim 1, wherein the metal substrate has a plurality of support structures extending outward from the metal substrate, each of the support structures having a pair of connectors with a gap between the connectors.

9. The pressure sensor package of claim 1, wherein the pressure sensor comprises a first glass substrate comprising an opening forming the pressure sensor port, a silicon die stacked on the first glass substrate and comprising a membrane and a second glass substrate stacked on the silicon die and comprising a cavity, wherein the opening is aligned with the open passage and with the membrane at one side of the membrane to permit air flowing into the open passage to impinge upon the membrane, and wherein the cavity is aligned with the membrane at an opposite side of the membrane as the opening to permit movement of the membrane in response to the air flow.

10. The pressure sensor package of claim 1, wherein the pressure sensor comprises a silicon die comprising a recessed region and a membrane over the recessed region, and wherein the recessed region forms the pressure sensor port and is aligned with the open passage to permit air flowing into the open passage to impinge upon the membrane.

11. The pressure sensor package of claim 1, further comprising:
a silicone gel covering the logic die, the pressure sensor and part of the electrical conductors and interposed between the molding compound and both the logic die and the pressure sensor.

12. The pressure sensor package of claim 1, wherein the external electrical contacts are at a side of the pressure sensor package opposite the pressure sensor port.

13. A method of manufacturing a pressure sensor package, the method comprising:
providing a pressure sensor comprising a first side with a pressure sensor port, a second side opposite the first side, and electrical contacts, and a logic die comprising a first side and a second side opposite the first side with electrical contacts, the logic die operable to process signals from the pressure sensor;
attaching the first side of the logic die to the second side of the pressure sensor so that the logic die is laterally offset from the electrical contacts of the pressure sensor;
connecting the electrical contacts of the pressure sensor to the electrical contacts of the logic die via electrical conductors;
encapsulating the pressure sensor, the logic die and the electrical conductors with molding compound, the molding compound having an opening defining an open passage to the pressure sensor port; and
providing external electrical contacts at a side of the pressure sensor package.

14. The method of claim 13, further comprising:
attaching a metal substrate to the first side of the pressure sensor, the metal substrate partly encapsulated by the molding compound so that an opening in the metal substrate aligned with the pressure sensor port is uncovered by the molding compound.

15. The method of claim 14, further comprising:
embedding a first end of a plurality of leads in the molding compound so that a second end of the leads protrudes out of the molding compound, the second end of the leads forming the external electrical contacts of the pressure sensor package; and
connecting the first end of the leads to the electrical contacts of at least one of the pressure sensor and the logic die via additional electrical conductors.

16. The method of claim 15, wherein the first end of the leads terminate in the molding compound at a different level than the metal substrate so that the first end of the leads and the metal substrate are vertically offset within the molding compound.

17. The method of claim 16, wherein the metal substrate is part of a copper lead frame strip and attached to a periphery of the copper lead frame strip by a plurality of support structures extending outward from the metal substrate, the method further comprising:
drawing the copper lead frame strip to form the support structures so that the first end of the leads and the metal substrate are vertically offset within the molding compound by a distance of at least five times the thickness of the metal substrate; and
severing the support structures after the pressure sensor, the logic die and the electrical conductors are encapsulated by the molding compound, so that the metal substrate is disconnected from the periphery of the copper lead frame strip.

18. The method of claim 17, wherein the copper lead frame strip is drawn by a multi-step drawing process so that the support structures extend along a first planar level at a first end of the support structures attached to the periphery of the copper lead frame strip, extend along a second planar level at a second end of the support structures attached the metal substrate and extend along a third planar level between the first and second ends of the support structures.

19. The method of claim 13, wherein the pressure sensor comprises a first glass substrate comprising an opening forming the pressure sensor port, a silicon die stacked on the first glass substrate and comprising a membrane and a second glass substrate stacked on the silicon die and comprising a cavity, the method further comprising:
aligning the opening with the open passage and with the membrane at one side of the membrane to permit air flowing into the open passage to impinge upon the membrane; and
aligning the cavity with the membrane at an opposite side of the membrane as the opening to permit movement of the membrane in response to the air flow.

20. The method of claim 13, wherein the pressure sensor comprises a silicon die comprising a recessed region and a membrane over the recessed region, and wherein the recessed region forms the pressure sensor port, the method further comprising:
aligning the recessed region with the open passage to permit air flowing into the open passage to impinge upon the membrane.

21. A pressure sensor assembly, comprising:
a board comprising an insulating member and a plurality of traces insulated from one another by the insulating member; and
a pressure sensor package attached to the board, the pressure sensor package comprising:
a pressure sensor comprising a first side with a pressure sensor port, a second side opposite the first side, and electrical contacts;
a logic die stacked on the pressure sensor and comprising a first side attached to the second side of the pressure sensor and a second side opposite the first side with electrical contacts, the logic die laterally offset from the electrical contacts of the pressure sensor and operable to process signals from the pressure sensor;

electrical conductors connecting the electrical contacts of the pressure sensor to the electrical contacts of the logic die;

molding compound encapsulating the pressure sensor, the logic die and the electrical conductors, the molding compound having an opening defining an open passage to the pressure sensor port; and external electrical contacts at a side of the pressure sensor package and connected to at least some of the traces of the board.

22. The pressure sensor assembly of claim 21, wherein the external electrical contacts are at a side of the pressure sensor package opposite the pressure sensor port.

\* \* \* \* \*